US009188876B2

(12) United States Patent
Lee et al.

(10) Patent No.: US 9,188,876 B2
(45) Date of Patent: Nov. 17, 2015

(54) METHOD OF DETERMINING OVERLAY ERROR AND CONTROL SYSTEM FOR DYNAMIC CONTROL OF RETICLE POSITION

(75) Inventors: Yung-Yao Lee, Zhubei (TW); Sophia Wang, Xin-Zhu (TW); Fei-Gwo Tsai, Taipei (TW); Heng-Hsin Liu, New Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 869 days.

(21) Appl. No.: 13/368,085

(22) Filed: Feb. 7, 2012

(65) Prior Publication Data

US 2013/0201462 A1 Aug. 8, 2013

(51) Int. Cl.
*G03B 27/68* (2006.01)
*G03B 27/32* (2006.01)
*G03F 7/20* (2006.01)
*G03F 1/44* (2012.01)
*G03B 27/42* (2006.01)

(52) U.S. Cl.
CPC .............. *G03F 7/70633* (2013.01); *G03F 1/44* (2013.01)

(58) Field of Classification Search
CPC ............ G03F 7/70616; G03F 7/70633; G03F 7/70666; G03F 7/70675; G03F 7/70683; G03F 9/70; G03F 9/7003; G03F 1/44
USPC ................. 355/52, 53, 55, 67–77; 250/492.1, 250/492.2, 492.22, 493.1, 548; 430/5, 8, 430/22, 30, 311, 312, 321
See application file for complete search history.

(56) References Cited

U.S. PATENT DOCUMENTS

| 5,444,538 | A  | * | 8/1995  | Pellegrini ...................... 356/401 |
|-----------|----|---|---------|-------------------------------------------|
| 5,596,204 | A  | * | 1/1997  | Irie et al. ....................... 250/548 |
| 6,266,144 | B1 |   | 7/2001  | Li |
| 6,699,627 | B2 | * | 3/2004  | Smith et al. ...................... 430/22 |
| 7,586,609 | B2 | * | 9/2009  | Lin et al. ........................ 356/401 |
| 2002/0014601 | A1 | * | 2/2002 | Yoshida ......................... 250/548 |
| 2005/0173653 | A1 | * | 8/2005 | Yamada ..................... 250/492.1 |
| 2005/0188342 | A1 | * | 8/2005 | Goodwin ......................... 716/21 |
| 2005/0219484 | A1 |   | 10/2005 | Chiang et al. |
| 2009/0030640 | A1 |   | 1/2009  | Takeuchi et al. |
| 2011/0131007 | A1 |   | 6/2011  | Huang et al. |
| 2011/0170091 | A1 | * | 7/2011 | Chang et al. ............... 356/237.5 |

FOREIGN PATENT DOCUMENTS

| JP | H06216206   | 8/1994  |
| JP | 4558016     | 7/2010  |
| KR | 1995-0034473 | 12/1995 |

OTHER PUBLICATIONS

Office Action Aug. 6, 2013 and English Translation from corresponding application No. KR10-2012-0048816.
Decision for Patent dated Oct. 16, 2013 and English Translation from corresponding application No. KR 10-2012-0048816.

* cited by examiner

*Primary Examiner* — Christina Riddle
(74) *Attorney, Agent, or Firm* — Hauptman Ham, LLP

(57) ABSTRACT

A method of determining overlay error. The method includes transferring a pattern from a reticle to a wafer and selecting a first set of data points to measure the positional difference between features on the reticle and features on the wafer. The method also includes determining a second set of data points characteristic of the first set of data points but containing fewer data points. A control system for using the second set of data points to dynamically adjust the position of the reticle.

20 Claims, 5 Drawing Sheets

METHOD OF DETERMINING OVERLAY ERROR AND CONTROL SYSTEM FOR DYNAMIC CONTROL OF RETICLE POSITION

BACKGROUND

As technology nodes decrease in size, the density of features on a substrate increases. The increased feature density requires more precise control of spacing between features to produce viable devices. Feature spacing is determined in part by the feature layout on the reticle used in patterning the substrate. Additional factors such as overlay error also impact the spacing of features on the substrate. Overlay error is the difference between the feature layout on the reticle and the actual feature pattern formed on the substrate.

Overlay error is caused by correctable factors such as differences in thermal expansion coefficients between the reticle and the substrate, inaccuracy in substrate shape, misalignment of the reticle and the substrate, inaccurate calibration of actuators in the patterning apparatus, etc. Differences in thermal expansion cause overlay error because the patterning process generates thermal energy which causes the substrate and the reticle to expand. If the materials used to form the substrate and reticle have different thermal expansion coefficients, the rate of expansion for the substrate and reticle are different. The different rates of expansion result in different feature spacing on the reticle as compared to the spacing of features on the substrate. Inaccuracy in substrate shape causes overlay error because curves in the substrate surface cause the dimensions of a feature to change because patterning light travels a different distance to reach the substrate surface. Misalignment of the reticle and substrate causes overlay error because the entire layout is shifted. Inaccurate calibration of actuators causes overlay error because patterning processes use actuators to position the reticle, the substrate and other components of the patterning apparatus. If the movement caused by the actuators is not accurate, the spacing between features is changed by the difference in the intended movement from the actual movement.

Additionally, some overlay error is caused by uncorrectable factors, such as light scattering or thickness gradients in a photoresist layer on the substrate. This uncorrectable overlay error is called residual error. Some amount of residual error is unavoidable.

Some techniques measure the overlay error by using fixed, predetermined reference points. The reference points are selected prior to performing any patterning process and fail to account for actual measured differences between the reticle and the substrate. The position of several selected features on the reticle is measured, prior to patterning the substrate. The substrate is then patterned and the position of these same selected features is measured on the patterned substrate. The difference between the position of the selected features on the reticle and the position of the selected features on the substrate determines the overlay error.

A measurement system for measuring the position of features on a substrate includes a radiation source, a detector and a stage to support the substrate. Light from the radiation source contacts the patterned surface of the substrate and is reflected toward the detector. The light from the radiation source is targeted on the predetermined reference points. The detector transfers the information to a calculating unit, such as a computer, to determine the position of the selected features on the substrate.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
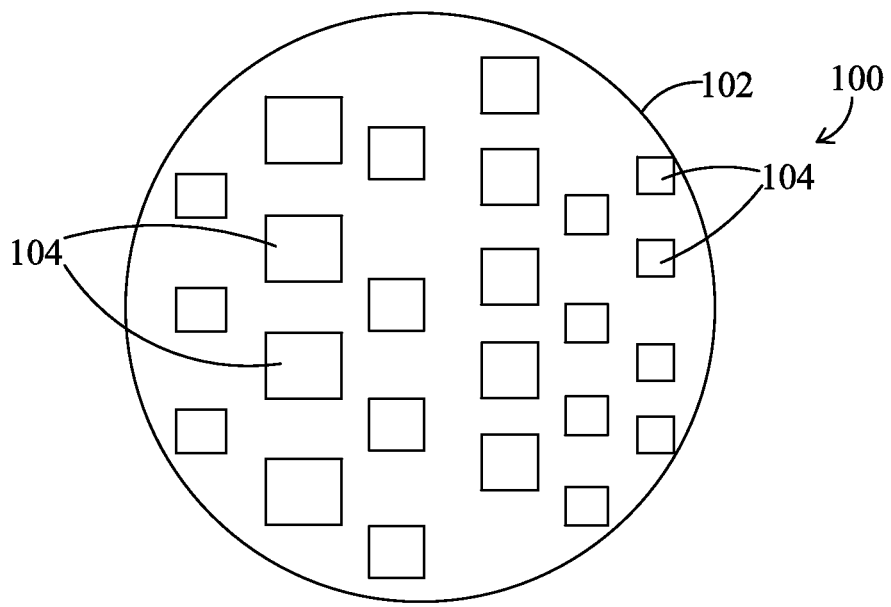
FIG. 1 is a diagram of a patterned element having a plurality of fields, according to one or more embodiments.

FIG. 1 is a diagram of a patterned element 100 having a wafer 102 and multiple fields 104. Wafer 102 is patterned, during a patterning process. In some embodiments, a reticle having a light blocking layer having a first surface and a second surface is used to pattern wafer 102. Wafer 102 includes a pattern of features formed during a patterning process. Each of the features corresponds to an opening in the reticle configured to allow light to pass from the first surface to the second surface.

Each field 104 is a subset of openings, and represents a collection of features to be patterned onto wafer 102. In some embodiments, each field 104 represents a circuit. In other embodiments, a group of fields 104 collectively represent a circuit. The collection of fields 104 on the wafer is called an overall layout of wafer 102.

Figure 2:
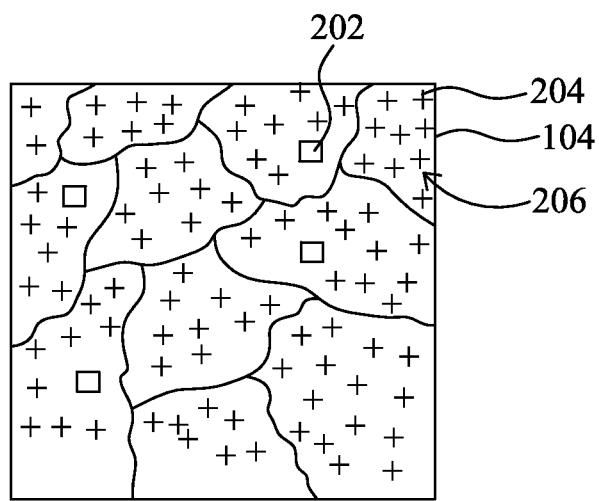
FIG. 2 is a diagram of a field having a plurality of initial measurement positions, according to one or more embodiments.

FIG. 2 is a diagram of a field 104 having multiple, fixed measurement positions 202, indicated by squares. Field 104 also has multiple initial measurement positions 204, indicated by '+' signs. Further, field 104 is subdivided into multiple regions 206.

Fixed measurement positions 202 represent the position of the most important features of field 104, as determined by a user. If the features represented by fixed measurement positions 202 are patterned imprecisely, a circuit formed using the features of field 104 will not function properly.

Initial measurement positions 204 represent other features of field 104 and are used to determine an overall layout of field 104. The initial measurement positions 204 are collectively called a first set of data points. The number of initial measure positions 204 is determined by the user. At least one initial measurement position 204 is within each region 206. In some embodiments, initial measurement positions 204 represent every feature of field 104. In other embodiments, initial measurement positions 204 represent less than every feature of field 104.

Figure 3:
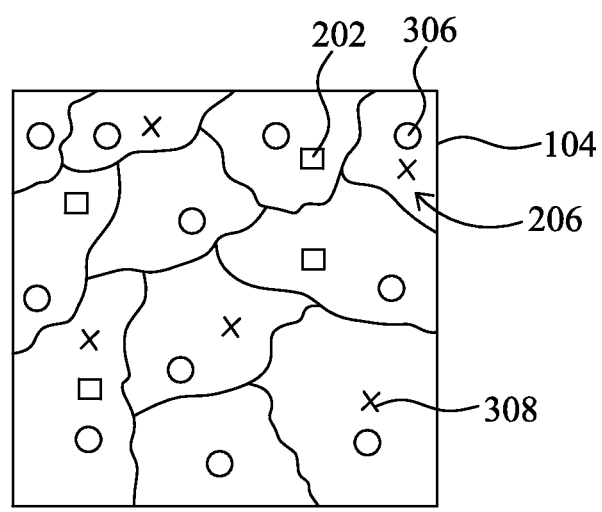
FIG. 3 is a diagram of a field having a plurality of selected measurement positions, according to one or more embodiments.

Regions 206 are groupings of features of field 104. In some embodiments, region boundaries are determined based on an outline of dies in field 104. In some embodiments, region boundaries are determined based on an outline of a circuit block, i.e., high speed circuit block, low speed circuit block, digital circuit block, analog circuit block, etc., in field 104. In some embodiments, region boundaries are selected to provide an even distribution of measurement positions. In some embodiments, region boundaries are specified by a designer. FIG. 3 depicts regions 206 having irregular boundaries. In some embodiments, regions 206 have regular boundaries. FIG. 3 depicts no spacing between regions. In some embodiments, regions 206 are separated by spaces free of features.

FIG. 3 is a diagram of a field 104 having multiple, fixed measurement positions 202, represented by squares; multiple regions 206; multiple region measurement positions 306, represented by circles; and multiple variable measurement positions 308, represented by '+' signs. Fixed measurement positions 202 are the same as those shown in FIG. 2. Region measurement positions 306 and variable measurement positions 308 are subsets of the initial measurement positions 204, shown in FIG. 2. That is, each region measurement position 306 and each variable measurement position 308 correspond to an initial measurement position 204.

Region measurement positions 306 and variable measurement positions 308 are collectively called a second set of data points. The user selects the number of positions in the second set of data points. The number of positions in the second set of data points is less than the number of positions in the first set of data points. The number of region measurement positions 306 and variable measurement positions 308 combined is equal to or less than the number of initial measurement positions 204. The selection of the number of data points in the second set of data points is based on production speed and precision. The larger the number of positions in the second set of data points, the more precise the measurement of the overlay error. However, a larger number of positions will slow the production process, because measuring time increases. The user must therefore determine the number of positions in the second set of data points appropriate for the production process. If the features of field 104 require extremely high precision, then a larger number of positions in the second set of data points is preferred.

Each region measurement position 306 is selected from the multiple initial measurement positions 204 as the most representative position within a region 206 for determining the position of features in each region 206, as a whole. Each region 206 includes one region measurement position 306. A location on wafer 102 corresponding to each region measurement position 306 is measured following the patterning process during the determination of overlay error. The determination of overall region measurement positions helps define final overlay error between wafer 102 and the reticle.

Each variable measurement position 308 is selected from initial measurement positions 204 as the most representative of the position of field 104 as a whole. The number of variable measurement positions 308 is determined by the difference in the number of region measurement positions 306 and the second set of data points. A location on wafer 102 corresponding to each variable measurement position 308 is measured following the patterning process during the determination of overlay error. Variable measurement positions 308 also help to determine the type of overlay error in a manner similar to region measurement positions 306.

The number of positions in the second set of data points includes fixed 202, region 306 and variable 308 measurement positions. In some embodiments, determination of the second set of data points begins with determining the fixed measurement positions 202. Following determination of the fixed measurement positions 202, region measurement positions 306 are determined. The location of each region measurement position 306 within each region 206 is determined to minimize the overlay error using statistical analysis of overlay error measurements or other suitable numerical recipes. Following determination of region measurement positions 306, the remaining positions in the second set of data points are variable measurement positions 308. The location of each variable measurement position 308 is determined to minimize the overlay error using statistical analysis of overlay error measurements or other suitable numerical recipes.

Figure 4A:
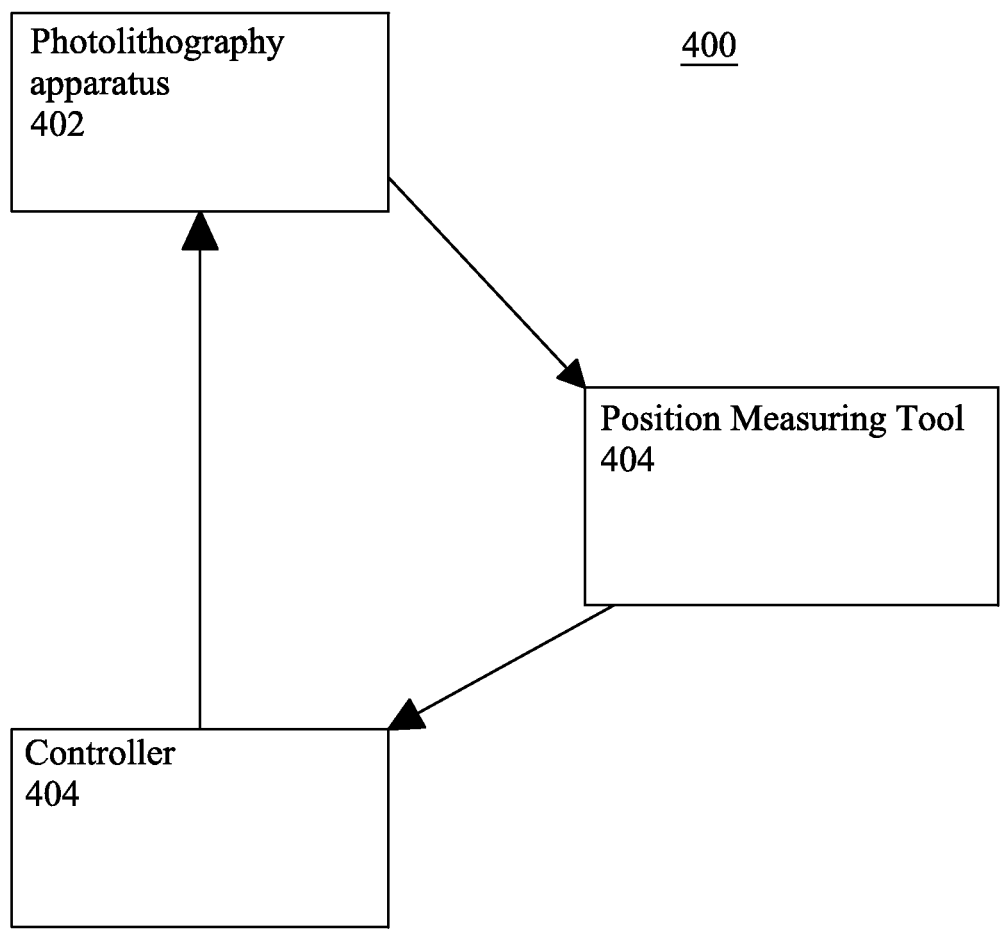
FIG. 4A is a high level block diagram of a feedback control system for reducing overlay error, according to one or more embodiments.

FIG. 4 is a high level block diagram of a feedback control system 400 for repositioning reticle 102 to minimize overlay error. Feedback control system 400 includes a photolithography apparatus 402 configured to pattern wafer 102 using the reticle. Feedback control system 400 further includes a position measuring tool 404 configured to determine the actual position of features corresponding to fixed measurement positions 202, region measurement positions 306 and variable measurement position 308 on wafer 102. Feedback control system 400 further includes a controller 406 configured to receive data from position measuring tool 404 and is further configured to transmit control signals. Photolithography apparatus 402 is configured to receive the control signals and alter the calibration of elements within photolithography apparatus 402 based on the control signals.

Photolithography apparatus 402 includes a light source for passing light through the reticle onto wafer 102 to transfer the overall layout of the reticle onto a light incident surface of wafer 102. In the embodiment of FIG. 4, wafer 102 is patterned using a photolithography apparatus 402. In some embodiments, wafer 102 is patterned using an electron beam patterning apparatus or other suitable patterning apparatus.

Following the patterning of wafer 102, wafer 102 is transferred to position measurement tool 404. Position measurement tool 404 is similar to the device described above for determining the position of features on wafer 102. Position measurement tool 404 is configured to transmit measurement data to controller 406.

Figure 4B:
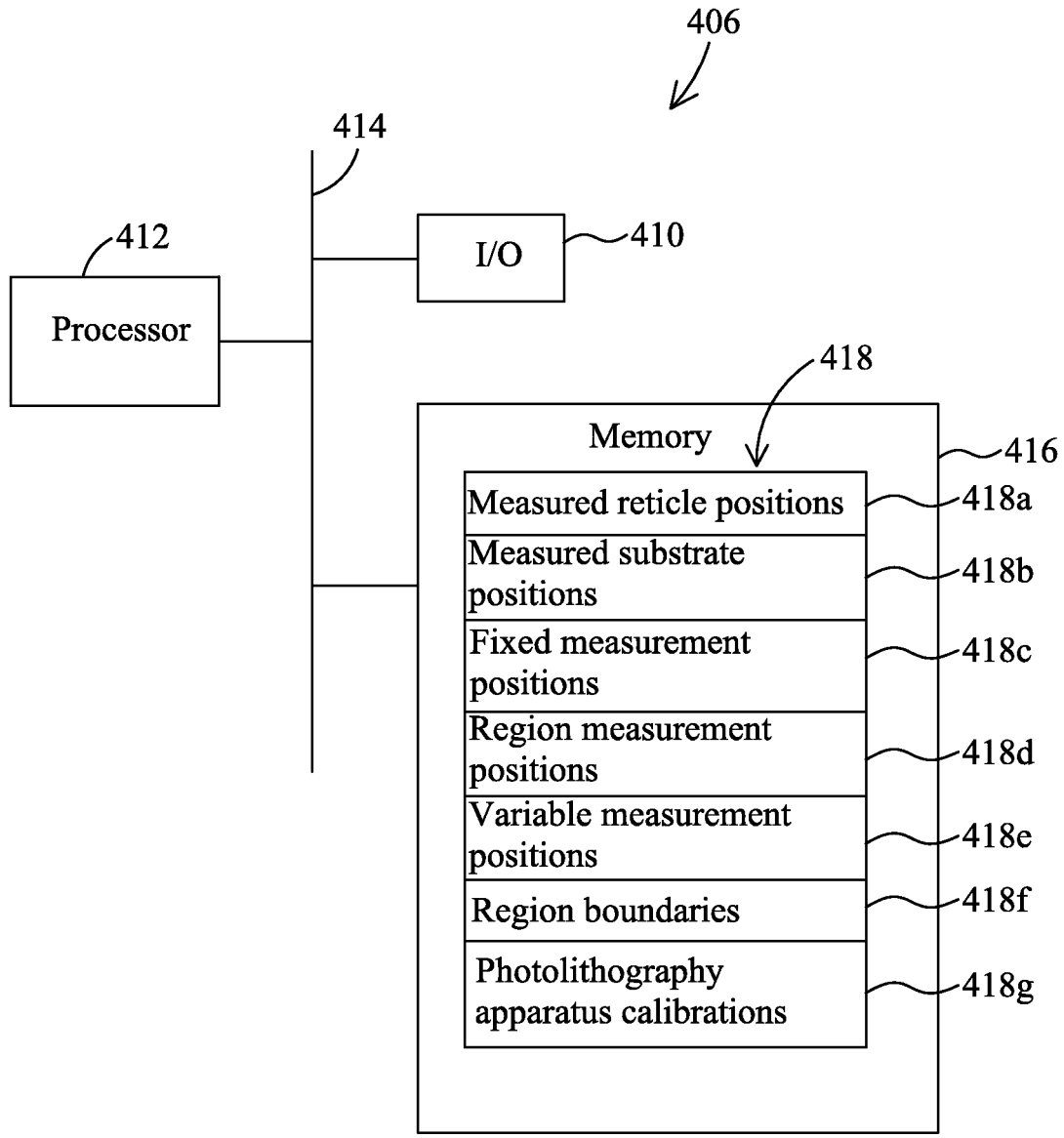
FIG. 4B is a block diagram of a control of the feedback control system, according to one or more embodiments.

FIG. 4B is a block diagram of controller 406. Controller 406 includes an input/output (I/O) device 410 for receiving information from position measurement tool 404 and transmitting control signals to photolithography apparatus 402. Controller 406 also includes a processor 412 connected to I/O device 410 by a bus 414, processor 412 is configured to calculate overlay error and calibration corrections to reduce overlay error. In some embodiments, processor 412 is a microprocessor, an application specific integrated circuit, or other suitable logic device. Controller 406 further includes a memory 416 connected to processor 412 and I/O device 410 by bus 414, memory 416 configured to store information related to feedback control system 400 and provide memory necessary for processor 412 to perform calculations. Memory 416 includes a variable storage unit 418 configured to store variables such as measured reticle positions 418a, measured wafer 102 positions 418b, fixed measurement positions 418c, region measurement positions 418d, variable measurement positions 418e, region boundaries 418f, photolithography apparatus calibrations 418g, or other suitable variables used in feedback control system 400. In some embodiments, I/O device 410 is configured to connect to a user interface to allow input of values such as fixed measurement positions 418c or region boundaries 418f.

Controller 406 is configured to receive the measurement data from position measurement tool 404 using I/O device

410. Controller 406 is also configured to calculate the difference between the actual position of features on wafer 102 and the position of features on the reticle to determine the overlay error, using processor 412. Controller 406 is further configured to transmit control signals to photolithography apparatus 402 based on the calculated position difference, using I/O device 410. Based on the control signals, photolithography apparatus 402 is configured to alter the position of the reticle or recalibrate components of a scanning apparatus to reduce the overlay error to the residual.

Figure 5:
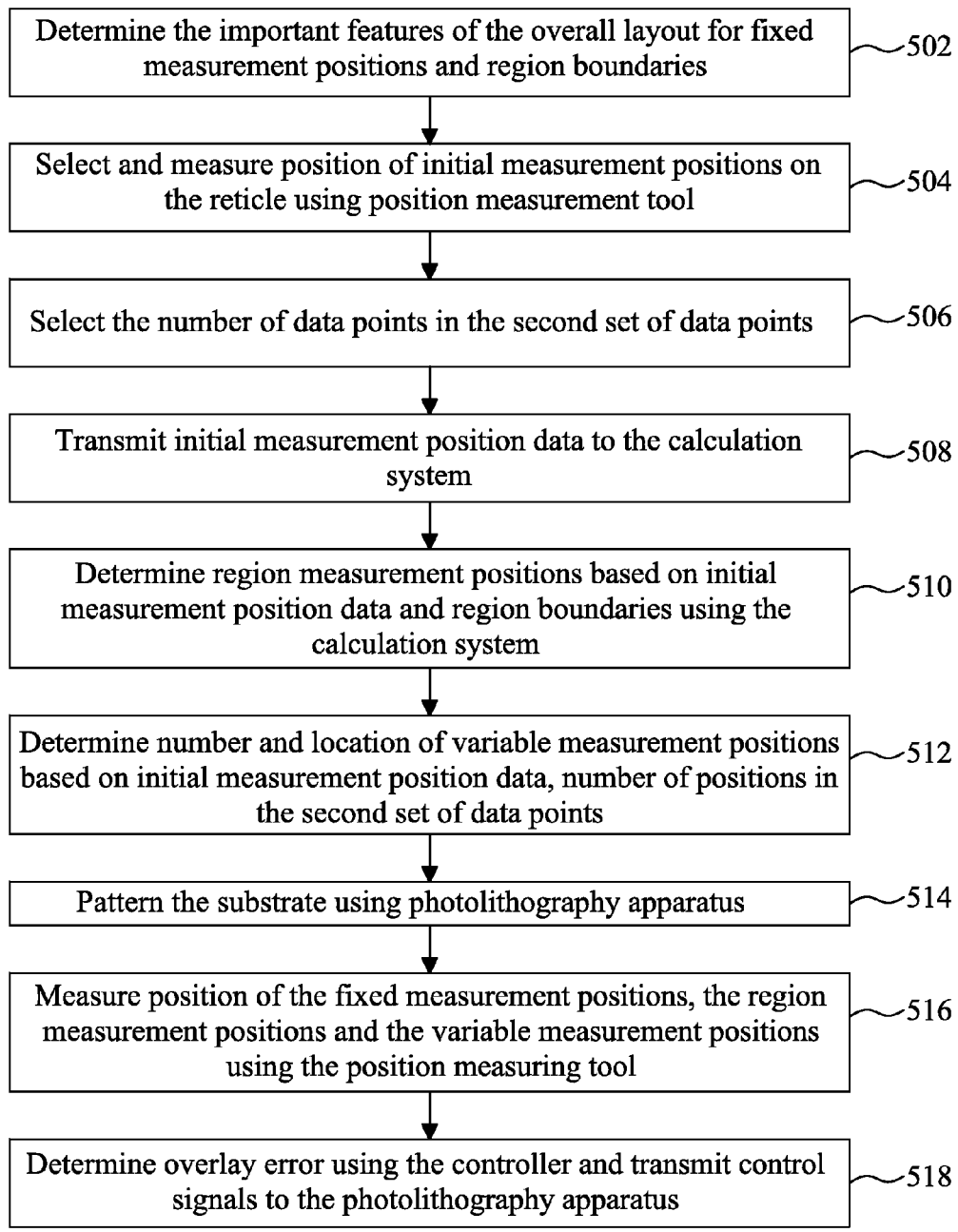
FIG. 5 is a flow chart of a method of reducing overlay error, according to one or more embodiments.

FIG. 5 is a flow chart for a method 500 of reducing the overlay error. Method 500 begins with step 502, in which the user determines the important features of field 104 corresponding to fixed measurement positions 202 and inputs those positions into the user interface connected to I/O device 410. In some embodiments, the user determines selected features of field 104 by monitoring the requirements of the devices within field 104 and determining which features are most indicative of proper performance of a device formed in field 104. Step 502 also includes determining the region boundaries and entering the region boundaries into the user interface connected to I/O device 410.

In step 504, the number and location of the initial measurement positions 204 are selected. Step 504 further includes, the position of initial measurement positions 204 (FIG. 2) on the reticle 102 is measured, using position measurement tool 404.

Method 500 continues with step 506, in which the number of data points in the second set of data points is selected based on production speed and precision.

The position of initial measurement positions 204 (FIG. 2) is then transmitted to a calculation system, in step 508. In step 510, the calculation system determines the region measurement positions 306 based on the positions of initial measurement positions 204 and the region boundaries defined in step 506. In step 512, the calculation system determines the number and location of variable measurement positions 308 based on the positions of initial measurement positions 204 and the number of positions in the second set of data points determined by the user.

The number of positions in the second set of data points includes fixed 202, region 306 and variable 308 measurement positions. In some embodiments, determination of the second set of data points begins with determining the fixed measurement positions 202. Following determination of the fixed measurement positions 202, region measurement positions 306 are determined. The location of each region measurement position 306 within each region 206 is determined to minimize the overlay error using statistical analysis of overlay error measurements or other suitable numerical recipes. Following determination of region measurement positions 306, the remaining positions in the second set of data points are variable measurement positions 308. The location of each variable measurement positions 308 is determined to minimize the overlay error using statistical analysis of overlay error measurements or other suitable numerical recipes.

In step 514, wafer 102 is patterned using photolithography apparatus 402. In step 516, the actual position of features corresponding to fixed measurement positions 202, region measurement positions 306 and variable measurement position 308 on wafer 102 are determined using position measuring tool 404.

The information from position measuring tool 404 is transferred to controller 406, in step 518. Controller 406 then determines the overlay error and transmits control signals to photolithography apparatus 402. Step 514, 516 and 518 are repeated throughout the production process to compensate for dynamic errors arising during the production process.

One aspect of this description relates to a method of reducing overlay error by transferring a pattern of features from a reticle to a wafer, measuring a positional difference between the pattern on the reticle and the pattern on the wafer as a first set of data points, determining a second set of data points characteristic of the first set of data points, and changing a position of the reticle to minimize the positional difference based on the second set of data points. Another aspect of this description relates to a reticle including at least one field, where each of the at least one field includes at least one feature, at least one fixed measurement position, at least one region measurement position, and at least one variable measurement position. A further aspect of this description relates to a feedback control system including a reticle patterning apparatus for transferring a pattern from a reticle to a wafer, a measurement tool for measuring the position of at least one feature of the pattern on the wafer, where the at least one position is characteristic of a position of the reticle relative to the wafer, and a controller for receiving position data from the measuring tool and transmitting at least one control signal to the reticle patterning apparatus based on the position data.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of reducing overlay error comprising:
   transferring a pattern of features from a reticle to a wafer;
   measuring a positional difference between the pattern on the reticle and the pattern on the wafer at a first set of data points;
   determining a second set of data points based on the first set of data points, the second set of data points being a subset of the first set of data points, wherein a position of the second set of data points is indicative of a position of at least one of the first set of data points, and a number of the first set of data points is greater than a number of the second set of data points; and
   changing a position of the reticle to minimize the positional difference based on the second set of data points,
   wherein the second set of data points comprises at least one region data point and at least one variable data point.

2. The method of claim 1, further comprising determining at least one fixed data point.

3. The method of claim 1, wherein determining the second set of data points comprises selecting data points from the first set of data points.

4. The method of claim 1, wherein determining the second set of data points comprises
   determining the at least one region data point; and
   determining the at least one variable data point,
   wherein a summation of a number of the at least one region data point, and a number of the at least one variable data points equals the number of the second set of data points.

5. The method of claim 4, wherein determining a plurality of fixed data points comprises receiving input from a user.

6. The method of claim 4, further comprising determining a plurality of regional boundaries in the pattern of features to define a plurality of regions; and positioning at least one of the first set of data points within each of the plurality of regions, wherein determining region data points includes selecting one of the at least one of the first set of data points within each of the plurality of regions for each of the plurality of regions.

7. The method of claim 4, wherein determining at least one variable data point includes selecting one or more data points characteristic of the positional difference.

8. The method of claim 4, wherein determining at least one variable data point includes statistical analysis of overlay error measurements.

9. The method of claim 4, wherein determining at least one region data point includes statistical analysis of overlay error measurements.

10. The method of claim 1, further comprising determining a plurality of regional boundaries in the pattern of features; and positioning at least one of the first set of data points within each of the plurality of regional boundaries.

11. The method of claim 1, wherein transferring the pattern of features from the reticle to the wafer includes using a photolithography process.

12. The method of claim 1, wherein transferring the pattern of features from the reticle to the wafer includes using an electron beam patterning process.

13. A method of reducing overlay error comprising:
transferring a pattern of features from a reticle to a wafer;
measuring a positional difference between the pattern on the reticle and the pattern on the wafer at a first set of data points;
changing a position of the reticle to minimize the positional difference based on a second set of data points, the second set of data points being a selected subset of the first set of data points; and
positioning at least one data point of the first set of data points within a regional boundary defining a predetermined region of a plurality of regions,
wherein the second set of data points comprises at least one region data point and a remainder of the data points of the second set of data points comprises at least one variable data point.

14. The method of claim 13, wherein at least one of the data points of the first set of data points is a fixed data point.

15. The method of claim 14, wherein the fixed data point is based on a user input.

16. The method of claim 13, wherein transferring the pattern of features from the reticle to the wafer includes using a photolithography process.

17. The method of claim 13, wherein transferring the pattern of features from the reticle to the wafer includes using an electron beam patterning process.

18. A method of reducing overlay error comprising:
transferring a pattern of features from a reticle to a wafer;
measuring a positional difference between the pattern on the reticle and the pattern on the wafer at a first set of data points; and
moving the reticle to change the positional difference based on a second set of data points, the second set of data points being a subset of the first set of data points,
wherein the second set of data points comprises at least one region data point and at least one variable data point, and a total quantity of region data points and variable data points is equal to a total quantity of data points of the second set of data points.

19. The method of claim 18, wherein the at least one region data point is based on a statistical analysis of overlay error measurements.

20. The method of claim 18, wherein the at least one variable data point is based on a statistical analysis of overlay error measurements.

* * * * *